United States Patent [19]

Gualtieri et al.

[11] Patent Number: 4,931,133
[45] Date of Patent: Jun. 5, 1990

[54] HIGH TEMPERATURE SOLUTION GROWTH OF BARIUM BORATE ($\beta$-BAB$_2$O$_4$)

[75] Inventors: Devlin M. Gualtieri, Ledgewood; Bruce H. T. Chai, Bridgewater, both of N.J.

[73] Assignee: Allied-Signal Inc., Morris Township, Morris County, N.J.

[21] Appl. No.: 287,824

[22] Filed: Dec. 21, 1988

Related U.S. Application Data

[63] Continuation-in-part of Ser. No. 150,127, Jan. 29, 1988, abandoned.

[51] Int. Cl.$^5$ .............................................. C30B 9/12
[52] U.S. Cl. .................... 156/621; 156/622; 156/624; 156/DIG. 78; 156/DIG. 86; 423/158; 423/279
[58] Field of Search ....... 156/621, 622, 624, DIG. 78, 156/DIG. 86; 423/158, 279, 282, 657

[56] References Cited

U.S. PATENT DOCUMENTS

| | | | |
|---|---|---|---|
| 2,647,043 | 7/1953 | Imber | 156/621 |
| 2,657,122 | 10/1953 | Chaudaye et al. | 156/621 |
| 3,725,298 | 4/1973 | Woodhead et al. | 156/624 |
| 4,036,655 | 7/1977 | Yamada et al. | 106/84 |
| 4,482,205 | 11/1984 | Logakos et al. | 501/37 |
| 4,683,126 | 7/1987 | Inoue et al. | 423/279 |

OTHER PUBLICATIONS

Elwell et al., Viscosity and Density of BaO/B$_2$O$_3$/BaF$_2$ Flukes and Solutions, Journal of Crystal Growth, vol. 24/25, 1974, pp. 651–655.

Jiang et al., Flux Growth of Large Single Crystals of Low Temperature Phase, Barium Metaborate, Journal of Crystal Growth, 79 (1986), pp. 963–969.

Benedikt in Bernichte Deutsch Chemische, Ges., No. 7, 1874, pp. 703 and 704.

*Primary Examiner*—John Doll
*Assistant Examiner*—Robert M. Kunemund
*Attorney, Agent, or Firm*—Gerhard H. Fuchs; Richard C. Stewart; Ernest D. Buff

[57] ABSTRACT

A method of growing optical quality $\beta$-BaB$_2$O$_4$ crystals involves growing these crystals from a fluxed melt of BaB$_2$O$_4$, Na$_2$O and NaCl, in certain proportions.

9 Claims, 1 Drawing Sheet

HIGH TEMPERATURE SOLUTION GROWTH OF BARIUM BORATE ($\beta$-BAB$_2$O$_4$)

CROSS-REFERENCE TO RELATED APPLICATION

This application is a continuation-in-part of our commonly assigned co-pending U.S. application serial No. 150,127 filed Jan. 29, 1988, now abandoned.

BACKGROUND OF THE INVENTION

This invention relates to a method of growing crystals of $\beta$—BaB$_2$O$_4$ from a fluxed melt. More particularly, the invention relates to the growth of such crystals from a melt comprising barium borate, sodium oxide and sodium chloride, in certain proportions.

Beta-barium borate, the low temperature form of BaB$_2$O$_4$, is an important non-linear optical material which has been shown to be useful for second harmonic generation in laser systems. [D. Eimerl, L. Davis, S. Velsko, E.K. Graham, and A. Zalkin, J. Appl. Phys. 62(5), 1968-1983 (1987)]. More particularly, the use of such a material is, for example, in the environment of lasers as a "doubler" to obtain a different frequency light from a laser having a fundamental frequency. The material is particularly useful because it has been shown to be an efficient harmonic generator, has a high optical damage threshold, and is essentially transparent to ultraviolet light as short as 190nm in wavelength.

Barium borate typically melts congruently at 1095° C., but the solid that crystallizes just below this melting point is a centrosymmetric crystal which does not exhibit non-linear optical properties and is not useful in second harmonic generation. Thus, it becomes important to appreciate that below a temperature of about 925° C., barium borate exists in another crystal form, usually called the beta-barium borate form.

This low temperature form was originally thought to be C2/c, but current work has found this form to be R3c. This beta form can be crystallized from solution below this phase transition temperature, i.e., below about 925° C. An essential requirement is that a solution is required which will dissolve BaB$_2$O$_4$ below this transition temperature and will then supersaturate the $\beta$—BaB$_2$O$_4$ upon cooling to cause crystals of $\beta$—BaB$_2$O$_4$ to nucleate and grow, or to cause a dipped "seed" crystal to grow in size.

A number of important criteria must be met for selection of the solvent components of such a solution. First, the solvent atoms should be either components of the crystal itself, or they should be atoms which do not enter the crystal lattice as impurities to such an extent as to degrade the desired crystal properties. Secondly, the solvent components should be compatible with the crucible and furnace materials at the growth temperature. Thirdly, the solution should have a sufficient range of supersaturation to inhibit the nucleation of crystals in cooler parts of the crucible away from the seed crystal. Finally, the solution should be compatible with a crystal growth rate slow enough to yield high quality crystals, but not sufficiently slow as to make it commercially undesirable.

In the past, crystals of $\beta$—BaB$_2$O$_4$ have been grown at the Fujian Institute in the People's Republic of China from solutions of BaB$_2$O$_4$ with BaCl$_2$, BaF$_2$, Li$_2$O$_3$, Na$_2$O, B$_2$O$_3$ and Na$_2$B$_2$O$_4$ (J. Aidong C. Fen L. Qi, C. Zusheng, and Z. Yong, J. Crystal Growth 79, 963-969 (1986)). The best crystals by admission were obtained from solutions with Na$_2$O. However, the actual growth of the crystal was too slow to be commercially acceptable.

Barium borate crystals were first synthesized in 1874 by melting together NaBO$_2$ and NaCl, followed by cooling. From the resultant solid, the barium borate was obtained in the form of small, needle-form crystals on removal of the NaCl from the product by soaking in water. (R. Benedikt, Ber. Deut. Chem. Ges. 7, 703 (1874)).

Thus, up to now pure $\beta$—BaB$_2$O$_4$ crystals have not been grown at a commercially acceptable rate, and those crystals which are of acceptable quality for optical applications take so long to grow that other less expensive alternatives must be sought.

The present invention, avoids these disadvantages and provides a method which permits growth of good optical quality $\beta$—BaB$_2$O$_4$ crystals at acceptable rates.

SUMMARY OF THE INVENTION

In accordance with the present invention, there is provided a method of growing crystalline $\beta$—BaB$_2$O$_4$ from a fluxed melt, which method comprises forming a melt of from about 31 to about 78 mol percent of BaB$_2$O$_4$, from about 1.5 to about 23 mol percent of Na$_2$O, and from about 7.5 to about 67 mol percent of NaCl, followed by cooling the melt to cause formation of crystalline $\beta$—BaB$_2$O$_4$ The resultant crystals of $\beta$—BaB$_2$O$_4$ are of useful, short prismatic or nearly spherical shape, rather than in long needle form.

The present invention therefore is based on the discovery that, by combining both NaCl and Na$_2$O in the flux, one greatly increases the growth rate of the desired $\beta$—barium borate crystals, well beyond the rate obtainable with Na$_2$O flux, and at the same time advantageously controls the shape of the crystals. The crystals obtained from NaCl flux are long, needle-like and thus of little use for the aforementioned optical applications.

In yet a more specific aspect, the method comprises the steps of first heating a mixture of BaCO$_3$, B$_2$O$_3$, Na$_2$CO$_3$ and NaCl in a furnace at a rate, and to a temperature, sufficient to decompose BaCO$_3$ into BaO and CO$_2$ and Na$_2$CO$_3$ into Na$_2$O and CO$_2$ without blowing out the material from a crucible in which it is contained. The melt is then held at a high temperature ("soaked") for a time and at a temperature sufficient to ensure that no solids remain in the melt, i.e. at a higher temperature. After soaking, the melt is cooled to about its crystallization temperature and a seed crystal is dipped therein. The seed is a $\beta$—Ba B$_2$O$_4$ crystal of sufficient size to cause crystal growth of $\beta$—BaB$_2$O$_4$ on the seed. The melt is cooled with the crystal therein preferably being rotated, until the melt forms a relatively large crystal around the seed. Alternatively, a seed need not be used, and a number of spontaneously nucleated crystals can be allowed to grow with reduction in temperature.

BRIEF DESCRIPTION OF THE DRAWINGS

Having briefly described the invention, the same will become better understood from the attached detailed discussion taken in conjunction with the attached drawings wherein.

DETAILED DESCRIPTION OF THE INVENTION

Figure 1:
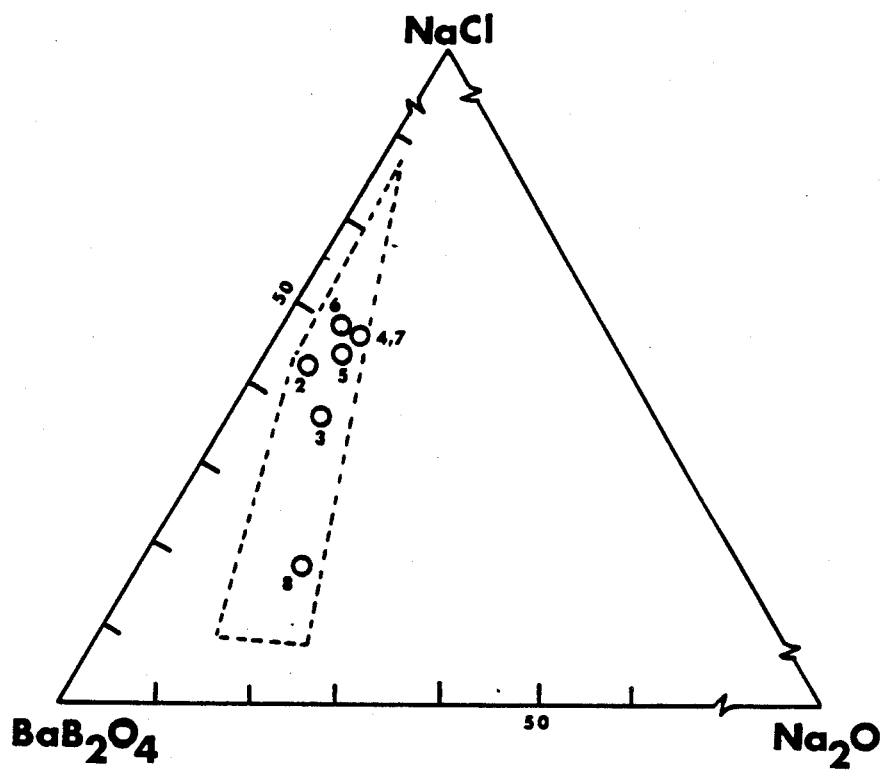
FIG. 1 shows a ternary composition diagram of the BaB$_2$O$_4$-NaCl-Na$_2$O solution system in accordance with the invention, wherein the composition range useful in our method is shown within the marked area.

As previously stated, because of the alpha-beta phase transition, beta-barium borate must be grown below the 925° phase transition temperature. Consequently, a flux must be used to lower the temperature. Both, $Na_2O$ and NaCl had been used for this purpose. We investigated the barium borate - sodium chloride system using differential thermal analysis techniques and found that the system formed a eutectic point at 25 mole percent barium borate 75 mole percent sodium chloride, with a eutectic temperature of 755° C. That part of the barium borate rich region which has a melt temperature below 925° C. (necessary for obtaining the β—form of the barium borate) was found to extend from about 45 to about 25 mole percent barium borate.

Based on this information, we grew $\beta$—$BaB_2O_4$ crystals from a melt of 45 mole percent barium borate and 55 mole percent sodium chloride.

Needle-shaped $\beta$—$BaB_2O_4$ crystallized almost immediately at the melt surface when the furnace temperature cooled just below 915° C. The growth rate of these needles was extremely rapid along the long axis direction (or the c-axis [0001]direction). Crystal needles with dimensions of 1 mm×20 mm were formed in minutes. The melt had very limited tolerance (<10° C.) of supercooling and significant supersaturation of the melt was not possible. At very slow cooling rates (<0.3° C./hr.), the needle shaped crystals can grow to larger volume with single crystals reaching both sides of the crucible (about 5 cm across).

Seeded growth was attempted using the spontaneous nucleated needle crystals as seeds. But the limited supersaturation of the melt led to extraneous nucleation of the crucible wall at the expense, or even total dissolution, of the seed. Growth on seed crystals, when it did occur, appeared to arise more from solute transport than from melt supercooling. In addition, at the growth temperature of $\beta$—$BaB_2O_4$, there was a slow but finite loss of the NaCl flux through evaporation. It further complicated the control of the growth rate and caused the increase of nucleation.

After several tries, we concluded that although the $BaB_2O_4$-NaCl system can produce $\beta$—$BaB_2O_4$ crystals, both the crystal shape and the extraneous nucleation make it very difficult to grow crystals of sufficient size and clarity for optical applications.

In order to achieve stable growth of $\beta$—$BaB_2O_4$ it is necessary to inhibit the tendency for spontaneous nucleation and to reduce the crystal growth rate. Only thus would it be possible to produce crystals of high optical quality. This we accomplish by providing a mixed sodium oxide-sodium chloride flux, employing the melt ingredients in the aforestated proportions. As raw materials to furnish these ingredients, barium carbonate, boron oxide, sodium carbonate and sodium chloride are suitably employed.

Generally, in accordance with the invention, barium carbonate, boron oxide, sodium carbonate and sodium chloride are placed in a platinum crucible and heated at a slow rate to allow evolution of carbon dioxide and the formation of barium oxide and sodium oxide. It is essential that the heating rate be slow to prevent the powder from being blown out of the crucible as a result of the release of carbon dioxide at too high a rate. Desirably, the melt components are heated to about 600° C., then to about 900-950° C. at a rate of about one half a degree per minute to homogenize the mixture. The resultant melt is maintained at this temperature for time sufficient to ensure homogenization, typically 20-24 hours. The melt is suitably prepared in an air atmosphere with an atmospheric pressure of about one atmosphere.

Thereafter, the melt is cooled, typically at a rate of 10° C. per hour until crystals appear on the surface of the melt. This will occur at a temperature of about 825-900° C. The melt is then reheated to above about 875° C. to re-dissolve the crystals. Thereafter the melt is ready for commencing crystal growth.

At this time, the solution is abruptly cooled to about 5° below the temperature at which the crystals redissolved. A seed crystal of about 5 grams in mass, hung from a platinum wire, typically on the end of a rod is dipped just below the melt surface to about the center of the melt with a unidirectional rotation of about 15-75RPM. The solution is then cooled at a rate of about 5° C. per day which results in the growth of a mass of crystal on the seed after about 2-5 days. The crystal mass is then withdrawn to just above the solution and the rotation is stopped. The furnace is cooled to about 500°-600° C. and the crystal is withdrawn from the furnace over a 4-8 hour period. Faster withdrawal from the furnace and consequent faster cooling than that discussed above may result in microcrack formation in the $\beta$—$BaB_2O_4$. Thus, it essential that the slow rate of cooling be maintained.

The resultant crystal in accordance with the invention is considered to be trigonal in nature, and an X-ray analysis of such crystals reveals the specific structure R3c [R. Frohlich, Z. Kristallogr. 165, 91 (1984).

Having generally described the invention in detail, the following example is intended to be illustrative only and not limiting in any way.

EXAMPLE 1

177.6 grams of $BaCO_3$, 62.7 grams of $B_2O_3$ 10.0 grams of $Na_2CO_3$ and 107.5 grams of NaCl were mixed together to form a melt for growing a crystal in accordance with the invention. Initially, all components were placed in a platinum crucible and heated at a slow rate to allow evolution of carbon dioxide gas in the formation of barium oxide and sodium oxide. The heating was conducted to about 600° C. and then the mixture was heated to about 950° C. in four hours to homogenize the components and held there for about 20 hours. The solution was then cooled to about 865° C. which resulted in the appearance of crystals on the melt surface. Heating thereafter to about 875° C. caused the crystals to dissolve back into solution. Thereafter, the solution was abruptly cooled about 5° below the temperature which the crystals dissolve back into solution and a seed crystal, hung from a platinum wire was dipped just below the melt surface with unidirectional rotation maintained of about 30RPM. The solution was cooled at a rate of about 5° per day which resulted in the growth of a mass more than 5 grams of crystal on the seed after 3 days. The crystal mass was withdrawn to just above the solution and the rotation was stopped. The furnace was thereafter cooled to about 500° C. and the crystal was withdrawn from the furnace simultaneously over a 4 hour period.

EXAMPLES 2-8

Following the general procedure of Example 1, seven different melt compositions were prepared, and $\beta$—$BaB_2O_4$ crystals were grown therefrom. These ternary combination of $BaB_2O_4$-$NaCl$-$Na_2O$ are listed in the Table below, and are indicated in FIG. 1. These compositions were also prepared from mixed powders and were heated and melted following the same procedure as with the NaCl flux. Sodium carbonate was used as the precursor for sodium oxide. Crystals of $\beta$—$BaB_2O_4$ were produced from all these melt compositions in the temperature range of 870 to 880° C.

TABLE

| Example | $BaB_2O_4$ mole-% | NaCl mole-% | $Na_2O$ mole-% |
|---|---|---|---|
| 2 | 52 | 42 | 6 |
| 3 | 54 | 36 | 10 |
| 4 | 46 | 46 | 8 |
| 5 | 48 | 44 | 8 |
| 6 | 47 | 47 | 6 |
| 7 | 46 | 46 | 8 |
| 8 | 66 | 17 | 17 |

The addition of $Na_2O$ to the $BaB_2O_4$-NaCl melt did reduce the crystal growth rate, especially along the [0001] or needle direction. The crystal morphology changed from needle or long prismatic shape to short prism or nearly spherical shape depending on the NaCl to $Na_2O$ ratio. There was also an apparent reduction of the NaCl evaporation and the spurious nucleation was also greatly reduced. In addition, there was also an increase of melt surface tension which allowed better flux drainage upon the removal of crystals from the melt The ranges for the components comprising the melt for growing $\beta$—$BaB_2O_4$ in accordance with the present invention are as follows (all in mole percent):

|  | Operable | Preferred | More Preferred |
|---|---|---|---|
| $BaB_2O_4$ | 31-78 | 31-58 | 42-50 |
| $Na_2O$ | 1.5-23 | 1.5-13 | 3-11 |
| NaCl | 7.5-67 | 35-67 | 42-50 |

Having described the invention, the scope thereof may be obtained from the attached claims which are intended to be non-limiting.

We claim:

1. The method of growing crystalline $\beta$—$BaB_2O_4$ from a fluxed melt, which comprises forming a melt comprising from about 31 to about 78 mol percent of $BaB_2O_4$, from about 1.5 to about 23 mol percent of $Na_2O$, and from about 7.5 to about 67 mol percent of NaCl, followed by cooling said melt to permit formation of crystalline $\beta$—$BaB_2O_4$.

2. The method of claim 1 wherein said melt is cooled to about its crystallization temperature, followed by contacting the melt with a $\beta$—$BaB_2O_4$ seed crystal and crystallizing the product on the seed crystal.

3. The method of claim 2 wherein the seed crystal is being rotated in contact with the melt.

4. The method of claim 1 wherein the melt comprises from about 31 to about 58 mol percent of $BaB_2O_4$, from about 1.5 to about 13 mol percent of $Na_2O$, and from about 35 to about 67 mol percent of NaCl.

5. The method of claim 4 wherein the melt is contacted with a $\beta$—$BaB_2O_4$ seed crystal and is cooled to about its crystallization temperature, and the $\beta$—$BaB_2O_4$ product is crystallized on the seed crystal.

6. The method of claim 1 wherein the melt comprises from about 42 to about 50 mol percent of $BaB_2O_4$, from about 3 to about 11 mol percent of $Na_{2O}$, and from about 42 to about 50 mol percent of NaCl.

7. The method of claim 6 wherein the melt is contacted with a $\beta$—$BaB_2O_4$ seed crystal and is cooled to about its crystallization temperature, and the $\beta$—$BaB_2O_4$ product is crystallized on the seed crystal.

8. The method of claim 1 wherein said melt comprising $BaB_2O_4$, $Na_2O$ and NaCl is formed by melting together $BaCO_3$, $B_2O_3$, $Na_2CO_3$ and NaCl.

9. The method of claim 8 wherein the melt is held at a temperature above crystallization temperature for time sufficient to obtain a homogeneous melt composition before proceeding with crystallization.

* * * * *